(12) United States Patent
Qi

(10) Patent No.: US 8,884,652 B2
(45) Date of Patent: Nov. 11, 2014

(54) LEVEL TRANSLATOR CIRCUIT, DRIVING CIRCUIT FOR DRIVING HIGH-VOLTAGE DEVICE AND METHOD THEREOF

(71) Applicant: iWatt Integrated Circuits Technology (Tianjin) Limited, Tianjin (CN)

(72) Inventor: Wei Qi, Beijing (CN)

(73) Assignee: iWatt Integrated Circuits Technology (Tianjin) Limited, Tianjin (CN)

( * ) Notice: Subject to any disclaimer, the term of this patent is extended or adjusted under 35 U.S.C. 154(b) by 0 days.

(21) Appl. No.: 14/097,085

(22) Filed: Dec. 4, 2013

(65) Prior Publication Data

US 2014/0152369 A1    Jun. 5, 2014

(30) Foreign Application Priority Data

Dec. 5, 2012  (CN) .......................... 2012 1 0518346

(51) Int. Cl.
  *H03L 5/00*      (2006.01)
  *H03K 19/0185*   (2006.01)
(52) U.S. Cl.
  CPC .............................. *H03K 19/018521* (2013.01)
  USPC .................................. 327/33; 326/62; 326/81
(58) Field of Classification Search
  USPC ................... 327/306, 333; 326/62–63, 80–81
  See application file for complete search history.

(56) References Cited

U.S. PATENT DOCUMENTS

| 5,510,731 | A   | * | 4/1996  | Dingwall ........................ 326/63  |
| 7,330,364 | B2  | * | 2/2008  | Lynch ............................. 363/84  |
| 8,004,339 | B2  | * | 8/2011  | Barrow ......................... 327/333   |
| 8,059,382 | B2  | * | 11/2011 | Schmidt ....................... 361/160   |

\* cited by examiner

*Primary Examiner* — Dinh Le
(74) *Attorney, Agent, or Firm* — Fenwick & West LLP

(57) ABSTRACT

The present invention provides a level translator circuit, a driving circuit for driving a high-voltage device and a corresponding method. The driving circuit for driving a high-voltage device comprises: a zener diode whose cathode is connected to a high-voltage power supply voltage and whose anode is connected to a ground potential of a low-voltage domain through a resistor; a high-voltage PMOS transistor whose gate is connected to an anode of the resistor, whose drain is connected to the ground potential of the low-voltage domain, and whose source is operable to supply a ground potential of a high-voltage domain; a level translator operable to convert a first signal in the low-voltage domain as received to a second signal in the high-voltage domain and output the second signal; and a low-voltage driving circuit operable to receive the second signal and adapt the second signal as a third signal which can drive the high-voltage device. The present invention allows for use of the low-voltage device to drive the high-voltage device to achieve the drive of the high-voltage device in a simple and efficient manner.

15 Claims, 2 Drawing Sheets

LEVEL TRANSLATOR CIRCUIT, DRIVING CIRCUIT FOR DRIVING HIGH-VOLTAGE DEVICE AND METHOD THEREOF

FIELD OF THE INVENTION

Embodiments of the present invention mainly relate to the technical field of electronic circuit design, and specifically to a level translator circuit, a driving circuit for driving a high-voltage device by using a low-voltage device, a level translating method and a driving method for driving the high-voltage device by using the low-voltage device.

BACKGROUND OF THE INVENTION

A semiconductor device such as a conventional transistor or CMOS generally operates under a low-voltage (namely, a difference between a high-voltage signal level and a low-voltage signal level is 5 volts). Such low-voltage devices are characterized by high speed, low power consumption and low thermal dissipation. However, in design of a new generation of electronic products, a low-voltage transistor or CMOS level already does not occupy a dominant position of a logic circuit any longer. Accordingly, semiconductor device manufacturers advance semiconductor devices which can operate normally under a high-voltage (namely, a difference between a high-voltage signal level and a low-voltage signal level is greater than 5 volts). Although such high-voltage devices substantially meet application needs most of the time, it is disadvantageous in complicated design and manufacture, high costs, low speed, high power consumption, high thermal dissipation as compared with the low-voltage devices.

In another aspect, higher voltage (e.g., greater than 5 volts) is necessarily needed to drive a semiconductor device such as a high-voltage CMOS. This requires a driving stage to be constructed by a device which can bear a higher voltage, which surely enlarges a size of an integrated circuit, increases costs and meanwhile imposes higher requirements for thermal dissipation.

SUMMARY OF THE INVENTION

One of objects of the present invention is to provide a solution of using a low-voltage device to control a high-voltage device using a signal in a low-voltage domain.

According to one aspect of the present invention, there is provided a driving circuit for driving a high-voltage device, comprising: a zener diode whose cathode is connected to a high-voltage power supply voltage and whose anode is connected to a ground potential of a low-voltage domain through a resistor; a high-voltage PMOS transistor whose gate is connected to an anode of the resistor, whose drain is connected to the ground potential of the low-voltage domain, and whose source is operable to supply a ground potential of a high-voltage domain; a level translator whose working voltage terminal is connected to the high-voltage power supply voltage, whose first grounded terminal is connected to the ground potential of the low-voltage domain, and whose second grounded terminal is connected to the ground potential of the high-voltage domain, the level translator being operable to convert a first signal in the low-voltage domain as received to a second signal in the high-voltage domain and output the second signal; and a low-voltage driving circuit connected between the high-voltage power supply voltage and the ground potential of the high-voltage domain, and being operable to receive the second signal and adapt the second signal as a third signal which can drive the high-voltage device.

In one example, the low-voltage driving circuit comprises: a low-voltage PMOS transistor and a low-voltage NMOS transistor, their gates being connected together to receive the second signal, their drains being connected together to provide the third signal, a source of the low-voltage PMOS transistor being connected to the high-voltage power supply voltage, and a source of the low-voltage NMOS transistor being connected to the ground potential of the high-voltage domain.

In one example, the low-voltage driving circuit comprises a low-voltage operational amplifier circuit whose input terminal is used to receive the second signal and whose output terminal is used to provide the third signal.

In one example, the driving circuit further comprises: a high-voltage PMOS transistor and a high-voltage NMOS transistor, a source of the high-voltage PMOS transistor and a source of the high-voltage NMOS transistor being respectively connected to the high-voltage power supply voltage and the ground potential of the low-voltage domain, a gate of the high-voltage PMOS transistor being used to receive the third signal, a gate of the high-voltage NMOS transistor being used to receive the first signal, and a drain of the high-voltage PMOS transistor and a drain of the high-voltage NMOS transistor being connected together to provide a fourth signal.

In one example, a variation range of the first signal is between 0 volt (V) and 5V, a variation range of the second signal and the third signal is between the high-voltage power supply voltage minus 5V and the high-voltage power supply voltage, and a variation range of the fourth signal is between 0 volt and the high-voltage power supply voltage.

In one example, the high-voltage power supply voltage is 100V or any predetermined voltage value below 100V.

In one example, the high-voltage power supply voltage is one of 8V, 12V, 20V, 24V and 48V.

In one example, the level translator comprises a plurality of switching elements.

In one example, the level translator comprises a first inverter and a second inverter which are connected in series, wherein the first inverter works between the high-voltage power supply voltage and the ground potential of the low-voltage domain to receive the first signal; and wherein the second inverter works between the high-voltage power supply voltage and the ground potential of the high-voltage domain to provide the second signal.

According to another aspect of the present invention, there is provided a method of driving a high-voltage device, comprising: providing a ground potential of a high-voltage domain by using a zener diode, a high-voltage PMOS transistor and a resistor, wherein a cathode of the zener diode is connected to a high-voltage power supply voltage, and an anode of the zener diode is connected to a ground potential of a low-voltage domain through the resistor, and wherein a gate of the high-voltage PMOS transistor is connected to an anode of the resistor, and an drain thereof is connected to the ground potential of the low-voltage domain, and a source thereof is operable to supply the ground potential of the high-voltage domain; using a level translator to convert a first signal in the low-voltage domain as received to a second signal in the high-voltage domain, wherein a working voltage terminal of the level translator is connected to the high-voltage power supply voltage, a first grounded terminal of the level translator is connected to the ground potential of the low-voltage domain, and a second grounded terminal of the level translator is connected to the ground potential of the high-voltage domain; and using a low-voltage drive circuit to adapt the second signal as a third signal which can drive the high-voltage device.

In one example, the low-voltage driving circuit comprises: a low-voltage PMOS transistor and a low-voltage NMOS transistor, their gates being connected together to receive the second signal, their drains being connected together to provide the third signal, a source of the low-voltage PMOS transistor being connected to the high-voltage power supply voltage, and a source of the low-voltage NMOS transistor being connected to the ground potential of the high-voltage domain.

In one example, the low-voltage driving circuit comprises a low-voltage operational amplifier circuit whose input terminal is used to receive the second signal and whose output terminal is used to provide the third signal.

In one example, the method further comprises: using a high-voltage PMOS transistor and a high-voltage NMOS transistor connected in series to provide a fourth signal based on the first signal and the third signal, wherein a source of the high-voltage PMOS transistor and a source of the high-voltage NMOS transistor are respectively connected to the high-voltage power supply voltage and the ground potential of the low-voltage domain, a gate of the high-voltage PMOS transistor is used to receive the third signal, a gate of the high-voltage NMOS transistor is used to receive the first signal, and a drain of the high-voltage PMOS transistor and a drain of the high-voltage NMOS transistor are connected together to provide the fourth signal.

In one example, a variation range of the first signal is between 0 volt and 5V, a variation range of the second signal and the third signal is between the high-voltage power supply voltage minus 5V and the high-voltage power supply voltage, and a variation range of the fourth signal is between 0 volt and the high-voltage power supply voltage.

In one example, the high-voltage power supply voltage is 100V or any predetermined voltage value below 100V.

According to embodiments of the present invention, since high-voltage devices are no longer used to drive and control high-voltage devices, and instead, low-voltage devices are used to drive and control high-voltage devices, use of high-voltage tubes is reduced in circuit design and the size and area of resulting chip are decreased so that the level translator and the driving stage of the high-voltage devices operate at a high speed and with low power consumption and low thermal dissipation.

The features and advantages described in the specification are not all inclusive and, in particular, many additional features and advantages will be apparent to those having ordinary skill in the art in view of the drawings and specification. Moreover, it should be appreciated that the language used in the specification has been principally selected for readability and instructional purpose, and may not have been selected to delineate or circumscribe the inventive subject matter.

BRIEF DESCRIPTION OF DRAWINGS

The teachings of the embodiments of the present invention can be readily understood by considering the following detailed description in conjunction with the accompanying drawings.

Abbreviations occurring in the specification and/or figures are defined as follows:
CMOS complementary metal oxide semiconductor
IN input
MOSFET metal oxide semiconductor field effect transistor (briefly called MOS transistor)
NMOS N-type MOSFET
PMOS P-type MOSFET
OUT output
OUTs output of a level translator
OUTd output of a driving stage
R1 transistor
VDDH high-voltage power supply voltage (e.g., high-voltage power source voltage) or high-voltage power supply terminal
VH relative high-voltage power supply terminal
VL relative low-voltage power supply terminal
VSS logic ground
VFG floating ground voltage
Vthp a threshold voltage of a semiconductor device
VZ reverse break-down voltage of a zener
ZD zener diode
LV PMOS low-voltage PMOS
HV PMOS high-voltage PMOS
LV NMOS low-voltage NMOS
HV NMOS high-voltage NMOS
MP1, MP2, MP3 PMOS transistor
MN1, MN2, MN3 NMOS transistor

DETAILED DESCRIPTION OF PREFERRED EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

As an example, in the following descriptions, a range of voltage with a voltage difference of a signal amplitude between a high-voltage signal level and a low-voltage signal level less than or equal to 5V is called a low-voltage domain, namely, 0 volt to 5V. A device operating normally in such a voltage domain is called a low-voltage device. A voltage range with a voltage difference of a signal amplitude between a high-voltage signal level and a low-voltage signal greater than 5V is called a high-voltage domain. A device operating normally in such a voltage domain is called a high-voltage device.

Figure 1:
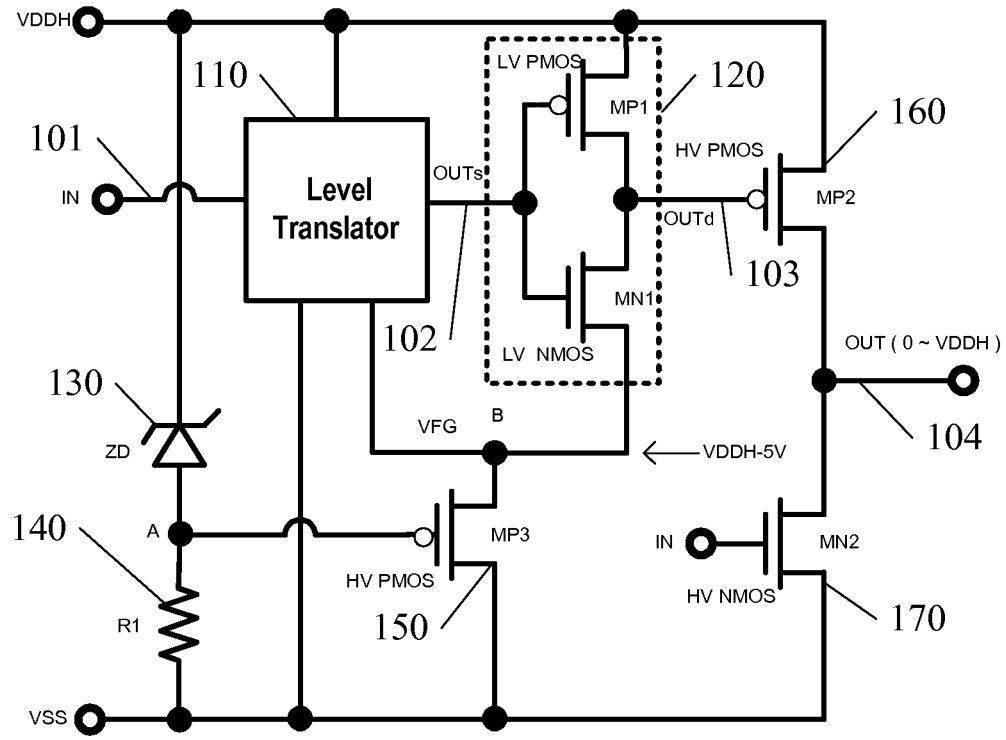
FIG. 1 illustrates a schematic view of a driving circuit according to an embodiment of the present invention.

FIG. 1 illustrates a schematic view of a driving circuit according to an embodiment of the present invention. The exemplary circuit comprises a level translator 110, a driving stage 120 and an output stage. The output stage comprises a high-voltage PMOS transistor 160 and a high-voltage NMOS transistor 170.

The level translator 110 is operable to receive an input signal 101 whose level varies between a high level and a low level of the low-voltage domain, and output an output signal 102 whose level varies between a high level (a high-voltage power supply voltage VDDH) and a low level (or called floating ground voltage VFG). A working voltage terminal of the level translator 110 is connected to the high-voltage power supply voltage VDDH, a first grounded terminal of the level translator 110 is connected to a ground potential VSS of the low-voltage domain, and a second grounded terminal of the level translator 110 is connected to a ground potential of the high-voltage domain. In an example, the high-voltage power supply voltage is 100V or any predetermine voltage value less than 100V. In some other examples, the high-voltage power supply voltage is one of 8V, 12V, 20V, 24V and 48V. The ground potential of the high-voltage domain is provided by a floating ground voltage production stage described in detail below.

The floating ground voltage production stage comprises a zener diode ZD130, a resistor R1 140 and a high-voltage PMOS transistor MP3 150. A cathode of the zener diode ZD is connected to the high-voltage power supply terminal VDDH and a anode of the zener diode ZD is connected to ground VSS through the resistor R1; the anode of the zener diode ZD is connected to a gate of the high-voltage PMOS transistor MP3, a drain of the high-voltage PMOS transistor MP3 is connected to ground VSS, and a source of the high-voltage PMOS transistor MP3 is operable to provide said ground potential of the high-voltage domain.

In the operation process of the schematic circuit diagram according to the embodiment of the present invention shown in FIG. 1, the voltage of the high-voltage power supply terminal VDDH (or power source terminal) is greater than a reverse break-down voltage VZ of the zener diode ZD, and a voltage VA at point A, namely, a voltage Vgd between the gate and the drain of the high-voltage PMOS transistor MP3, is VDDH-VZ. As such, MP3 is not switched on, and a voltage at the source of MP3 (namely the voltage at point B in FIG. 1, which may be identified as a floating ground voltage VFD) is $$VFG=VDDH-VZ-Vthp.$$

Wherein VFG represents the floating ground voltage, VDDH represents high-voltage power supply voltage, VZ represents the reverse break-down voltage of the zener diode, and Vthp represents a threshold voltage of the high-voltage PMOS transistor. According to properties of CMOS transistor, Vthp is equal to a voltage Vds between the drain and source of the MOS transistor.

According to an embodiment of the present invention, the zener diode ZD is usually selected in a way that its reverse break-down voltage VZ is equal to about 6V. As such, a threshold voltage of the MOS transistor is usually −1V, and then the floating ground voltage VFG=VDDH−VZ−Vthp=VDDH−5V.

According to one embodiment of the present invention, the voltage of the high-voltage power supply terminal VDDH is selected as 20V, and then a resultant floating ground voltage VFG is about 15V. Alternatively, the power source voltage VDDH according to the embodiment of the present invention may be further selected as 8V, 12V, 24V, 36V, 48V, or even up to 100V which is also feasible. Alternatively, it may be also selected in a way that its reverse break-down voltage is one of other values except for 6V.

According to one embodiment of the present invention, the resistor R1 is selected according to volt-ampere characteristics of the zener diode, and a suitable resistor R1 is selected to make the voltage-stabilizing characteristics of the zener diode ZD better.

According to an embodiment of the present invention, the floating ground voltage production stage may generate the ground potential of the high-voltage domain of VDDH-5V.

The level translator 110 as described above is operable to convert the received first signal 101 in the low-voltage domain to the second signal 102 in the high-voltage domain and output the second signal 102. Specific implementations of the level translator 110 may take any known form in the art and do not constitute limitations to the present invention. Two examples of the level translator 110 in the embodiments of the present invention will be described with reference to FIG. 2 and FIG. 3.

It should be appreciated that the first signal 101 may be either a digital signal or an analog signal; correspondingly, the second signal 102 may also be either a digital signal or an analog signal.

According to an embodiment of the present invention, when the first signal 101 is a signal at the ground potential (e.g., 0V) of the low-voltage domain, the level translator 110 outputs the ground potential signal (15V in one example) of the high-voltage domain as the second signal 102; when the first signal 101 is a signal at a high potential (e.g., 5V) of the low-voltage domain, the level translator 110 outputs a high potential signal (20V in one example) of the high-voltage domain as the second signal 102.

According to a further embodiment of the present invention, when the first signal 101 is a signal varying between the ground potential (e.g., 0V) of the low-voltage domain and the high potential (e.g., 5V) of the low-voltage domain, the level translator 110 outputs a signal varying between the ground potential signal (15V in one example) of the high-voltage domain and the high potential signal (20V in one example) of the high-voltage domain as the second signal 102.

Although the above embodiments are described with the low-voltage domain of 5V as an example, those skilled in the art will understand that the low-voltage domain and the high-voltage domain are relative concepts. The low-voltage domain of varying in the above embodiments is only exemplary. The solutions of the present invention will apply to a 1.8V voltage domain, 6V voltage domain, 10V voltage domain, 24V voltage domain, and so on.

FIG. 1 also exemplarily illustrates the driving stage 120 and the output stage. In this example, the driving stage 120 comprises a low-voltage PMOS transistor MP1 and a low-voltage NMOS transistor MN1 which are connected in series. The low-voltage PMOS transistor MP1 and the low-voltage NMOS transistor MN1 are complementary to each other, i.e., one of them is on and the other is off, vice versa. Gates of the low-voltage PMOS transistor MP1 and the low-voltage NMOS transistor MN1 are connected together to the output terminal of the level translator 110 and are operable to receive the second signal 102. A source of the low-voltage PMOS transistor MP1 is connected to the high-voltage power supply voltage VDDH. A source of the low-voltage NMOS transistor MN1 is connected to the ground potential of the high-voltage domain as mentioned above, namely, the floating ground VFG. Drains of the low-voltage PMOS transistor MP1 and the low-voltage NMOS transistor MN1 are connected together to provide a third signal 103. As such, the driving stage 120 adapts the second signal 102 as the third signal 103 which can drive a high-voltage device.

In another example, the driver 120 comprises a low-voltage operation amplifier (or circuit) which operates between the high-voltage power supply voltage and the ground potential of the high-voltage domain mentioned above to amplify the second signal 102 as the third signal 103 so as to drive a high-voltage device with sufficient power (e.g., the high-voltage MOS transistor 160 included in the output stage).

FIG. 1 further illustrates an optional output stage. The output stage comprises: the high-voltage PMOS transistor 160 and the high-voltage NMOS transistor 170 connected in series; a source of the high-voltage PMOS transistor 160 and a source of the high-voltage NMOS transistor 170 are respectively connected to the high-voltage power supply voltage VDDH and the ground potential VSS of the low-voltage domain; a gate of the high-voltage PMOS transistor 160 is used to receive the third signal 103, a gate of the high-voltage NMOS transistor 170 is used to receive the first signal 101, a drain of the high-voltage PMOS transistor 160 and a drain of the high-voltage NMOS transistor 170 are connected together to provide a fourth signal 104.

In the above example, the PMOS transistor and the NMOS transistor connected in series are complementary to each other (namely, when one MOS transistor is on, the other MOS transistor is off; vice versa), so the driving circuit shown in FIG. 1 may achieve the following function.

When the first signal 101 is a signal at the ground potential (e.g., 0V) of the low-voltage domain, the fourth signal 104 is also a signal at the ground potential (e.g., 0V) of the low-voltage domain. When the first signal 101 is a signal at a high potential (e.g., 5V) of the low-voltage domain, the fourth signal 104 is a signal at a high potential (e.g., 20V) of the high-voltage domain.

When the first signal 101 varies between the ground potential (e.g., 0V) of the low-voltage domain and the high potential (e.g., 5V) of the low-voltage domain, the fourth signal 104 varies between the ground potential (e.g., 0V) of the low-voltage domain and the high potential (e.g., 20V) of the high-voltage domain.

As can be seen from the above, although the output stage of the embodiment of the present invention operates at the high-voltage domain and its operation voltage is in a range from the VSS to the VDDH (e.g., 0V-20V), a low-voltage device (e.g., low-voltage MOS transistor, or a low-voltage operational amplifier) may be employed to implement the driving stage. As compared with the high-voltage device, the embodiment of the present invention reduces the number of high-voltage devices and thereby saves chip size and area and reduces the costs.

Figure 2:
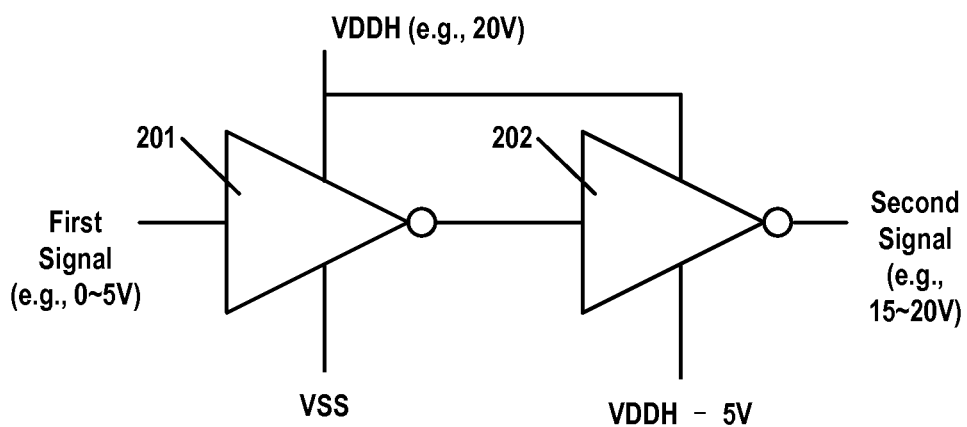
FIG. 2 illustrates a schematic view of a level translator circuit according to an embodiment of the present invention.

FIG. 2 illustrates a schematic view of a level translator circuit according to an embodiment of the present invention. As shown in FIG. 2, the level translator 110 comprises a first inverter 201 and a second inverter 202 which are connected in series, wherein the first inverter 201 works between the high-voltage power supply voltage VDDH and the ground potential VSS of the low-voltage domain to receive the first signal 101; and the second inverter 202 works between the high-voltage power supply voltage VDDH and the ground potential (namely, the above-mentioned VFD; e.g., VDDH-5V) of the high-voltage domain to provide the second signal 102.

Figure 3:
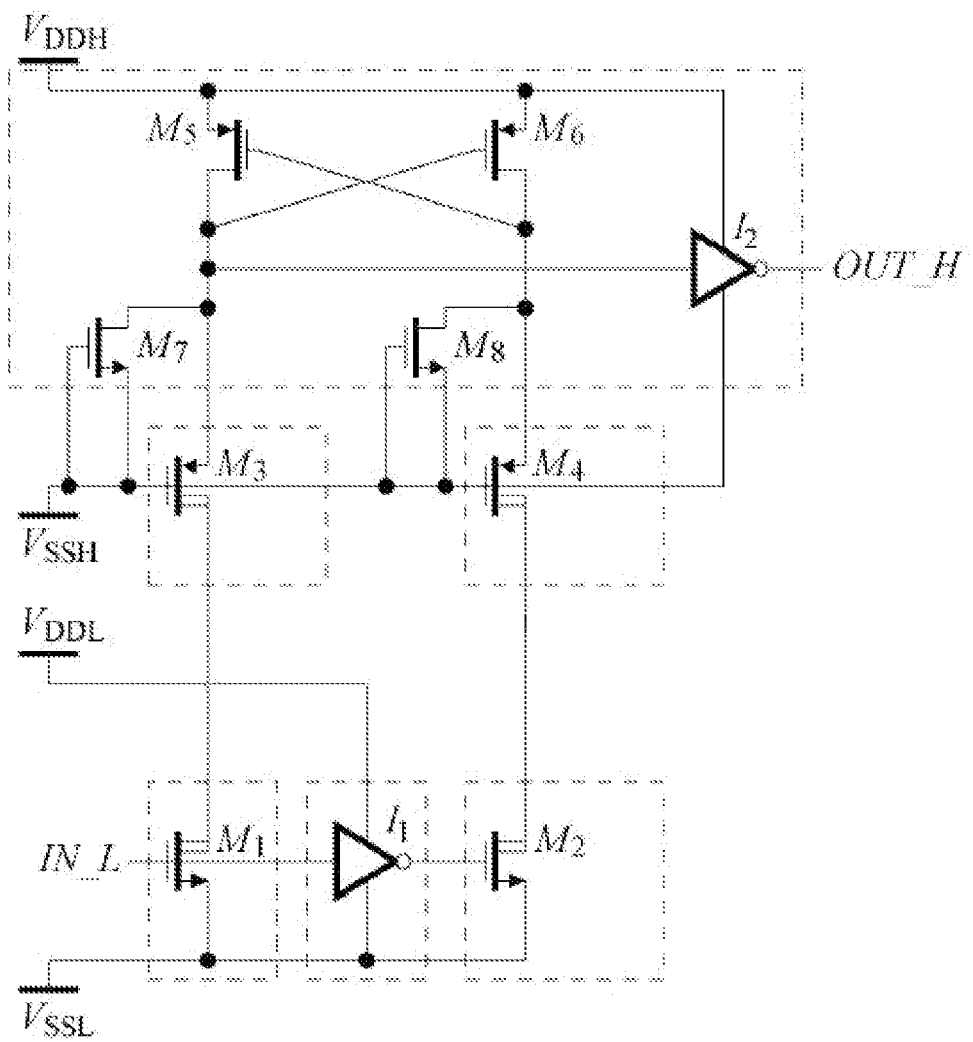
FIG. 3 illustrates a schematic view of another level translator circuit according to an embodiment of the present invention.

FIG. 3 illustrates a schematic view of another level translator circuit according to an embodiment of the present invention. As shown in FIG. 3, the level translator 110 comprises a plurality of switching elements (e.g., M1 to M8). As shown in FIG. 3, a terminal IN_L is used to receive the first signal 101 in FIG. 1, a terminal $V_{SSL}$ is connected to the VSS in FIG. 1, a terminal $V_{DDH}$ is connected to the VDDH in FIG. 1, and a terminal OUT-H is used to output the second signal 102 in FIG. 1. A voltage on a terminal $V_{DDL}$ may be obtained by dividing the voltage on the terminal $V_{DDH}$.

It should be appreciated that besides the level translator 110 shown in FIG. 2 and FIG. 3, any suitable level translator in the art may be employed so long as such level translator can convert the first signal 101 in FIG. 1 to the second signal 102 in FIG. 1.

In another embodiment, there is provided a method of driving a high-voltage device. The method comprises:

providing a ground potential VFG of a high-voltage domain by using a zener diode 130, a high-voltage PMOS transistor 150 and a resistor 140, wherein a cathode of the zener diode 130 is connected to a high-voltage power supply voltage VDDH, and an anode of the zener diode is connected to a ground potential VSS of a low-voltage domain through the resistor 140, and wherein a gate of the high-voltage PMOS transistor 150 is connected to an anode of the resistor 140, and an drain thereof is connected to the ground potential VSS of the low-voltage domain, and a source thereof is operable to supply the ground potential VFG of the high-voltage domain;

using a level translator 110 to convert a first signal 101 in the low-voltage domain as received to a second signal 102 in the high-voltage domain, wherein a working voltage terminal of the level translator 110 is connected to the high-voltage power supply voltage VDDH, a first grounded terminal of the level translator is connected to the ground potential VSS of the low-voltage domain, and a second grounded terminal of the level translator is connected to the ground potential VFG of the high-voltage domain; and using a low-voltage drive circuit 120 to adapt the second signal 102 as a third signal 103 which can drive the high-voltage device.

In one example, the low-voltage driving circuit 120 comprises: a low-voltage PMOS transistor and a low-voltage NMOS transistor, wherein gates of the low-voltage PMOS transistor and the low-voltage NMOS transistor are connected together to receive the second signal 102, drains of the low-voltage PMOS transistor and the low-voltage NMOS transistor are connected together to provide the third signal 103, a source of the low-voltage PMOS transistor is connected to the high-voltage power supply voltage VDDH, and a source of the low-voltage NMOS transistor is connected to the ground potential VFG of the high-voltage domain.

In one example, the low-voltage driving circuit 120 comprises a low-voltage operational amplifier circuit whose input terminal is used to receive the second signal 102 and whose output terminal is used to provide the third signal 103.

In one example, the method further comprises: using a high-voltage PMOS transistor 160 and a high-voltage NMOS transistor 170 connected in series to provide the fourth signal 104 based on the first signal 101 and the third signal 103. A source of the high-voltage PMOS transistor 160 and a source of the high-voltage NMOS transistor 170 are respectively connected to the high-voltage power supply voltage VDDH and the ground potential VSS of the low-voltage domain; a gate of the high-voltage PMOS transistor 160 is used to receive the third signal 103; a gate of the high-voltage NMOS transistor 170 is used to receive the first signal 101; and a drain of the high-voltage PMOS transistor 160 and a drain of the high-voltage NMOS transistor 170 are connected together to provide the fourth signal 104.

In one example, a variation range of the first signal 101 is between 0V and 5V, a variation range of the second signal 102 and the third signal 103 is between the high-voltage power supply voltage VDDH minus 5V and the high-voltage power supply voltage VDDH, and a variation range of the fourth signal 104 is between 0V and the high-voltage power supply voltage VDDH.

In one example, the high-voltage power supply voltage VDDH is 100V or any predetermined voltage value below 100V.

Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A driving circuit for driving a high-voltage device, comprising:
   a zener diode whose cathode is connected to a high-voltage power supply voltage and whose anode is connected to a ground potential of a low-voltage domain through a resistor;
   a high-voltage PMOS transistor whose gate is connected to an anode of the resistor, whose drain is connected to the ground potential of the low-voltage domain, and whose source is operable to supply a ground potential of a high-voltage domain;
   a level translator whose working voltage terminal is connected to the high-voltage power supply voltage, whose first grounded terminal is connected to the ground potential of the low-voltage domain, and whose second grounded terminal is connected to the ground potential of the high-voltage domain, the level translator being operable to convert a first signal in the low-voltage domain as received to a second signal in the high-voltage domain and output the second signal; and
   a low-voltage driving circuit connected between the high-voltage power supply voltage and the ground potential of the high-voltage domain, and being operable to receive the second signal and adapt the second signal as a third signal which can drive the high-voltage device.

2. The driving circuit according to claim 1, wherein the low-voltage driving circuit comprises: a low-voltage PMOS transistor and a low-voltage NMOS transistor, their gates being connected together to receive the second signal, their drains being connected together to provide the third signal, a source of the low-voltage PMOS transistor being connected to the high-voltage power supply voltage, and a source of the low-voltage NMOS transistor being connected to the ground potential of the high-voltage domain.

3. The driving circuit according to claim 1, wherein the low-voltage driving circuit comprises a low-voltage operational amplifier circuit whose input terminal is used to receive the second signal and whose output terminal is used to provide the third signal.

4. The driving circuit according to claim 2 or 3, further comprising: a high-voltage PMOS transistor and a high-voltage NMOS transistor, a source of the high-voltage PMOS transistor and a source of the high-voltage NMOS transistor being respectively connected to the high-voltage power supply voltage and the ground potential of the low-voltage domain, a gate of the high-voltage PMOS transistor being used to receive the third signal, a gate of the high-voltage NMOS transistor being used to receive the first signal, and a drain of the high-voltage PMOS transistor and a drain of the high-voltage NMOS transistor being connected together to provide a fourth signal.

5. The driving circuit according to claim 4, wherein a variation range of the first signal is between 0 volt and 5 volts, a variation range of the second signal and the third signal is between the high-voltage power supply voltage minus 5 volts and the high-voltage power supply voltage, and a variation range of the fourth signal is between 0 volt and the high-voltage power supply voltage.

6. The driving circuit according to any one of claims 1-3, wherein the high-voltage power supply voltage is 100 volts or any predetermined voltage value below 100 volts.

7. The driving circuit according to claim 6, wherein the high-voltage power supply voltage is one of 8 volts, 12 volts, 20 volts, 24 volts and 48 volts.

8. The driving circuit according to claim 1, wherein the level translator comprises a plurality of switching elements.

9. The driving circuit according to claim 1, wherein the level translator comprises a first inverter and a second inverter which are connected in series, wherein the first inverter works between the high-voltage power supply voltage and the ground potential of the low-voltage domain to receive the first signal; and wherein the second inverter works between the high-voltage power supply voltage and the ground potential of the high-voltage domain to provide the second signal.

10. A method of driving a high-voltage device, comprising:
    providing a ground potential of a high-voltage domain by using a zener diode, a high-voltage PMOS transistor and a resistor, wherein a cathode of the zener diode is connected to a high-voltage power supply voltage, and an anode of the zener diode is connected to a ground potential of a low-voltage domain through the resistor, and wherein a gate of the high-voltage PMOS transistor is connected to an anode of the resistor, and an drain thereof is connected to the ground potential of the low-voltage domain, and a source thereof is operable to supply the ground potential of the high-voltage domain;
    using a level translator to convert a first signal in the low-voltage domain as received to a second signal in the high-voltage domain, wherein a working voltage terminal of the level translator is connected to the high-voltage power supply voltage, a first grounded terminal of the level translator is connected to the ground potential of the low-voltage domain, and a second grounded terminal of the level translator is connected to the ground potential of the high-voltage domain; and
    using a low-voltage drive circuit to adapt the second signal as a third signal which can drive the high-voltage device.

11. The method according to claim 10, wherein the low-voltage driving circuit comprises: a low-voltage PMOS transistor and a low-voltage NMOS transistor, their gates being connected together to receive the second signal, their drains are connected together to provide the third signal, a source of the low-voltage PMOS transistor being connected to the high-voltage power supply voltage, and a source of the low-voltage NMOS transistor being connected to the ground potential of the high-voltage domain.

12. The method according to claim 10, wherein the low-voltage driving circuit comprises a low-voltage operational amplifier circuit whose input terminal is used to receive the second signal and whose output terminal is used to provide the third signal.

13. The method according to claim 11 or 12, further comprising: using a high-voltage PMOS transistor and a high-voltage NMOS transistor connected in series to provide a fourth signal based on the first signal and the third signal, wherein a source of the high-voltage PMOS transistor and a source of the high-voltage NMOS transistor are respectively connected to the high-voltage power supply voltage and the ground potential of the low-voltage domain, a gate of the high-voltage PMOS transistor is used to receive the third signal, a gate of the high-voltage NMOS transistor is used to receive the first signal, and a drain of the high-voltage PMOS transistor and a drain of the high-voltage NMOS transistor are connected together to provide the fourth signal.

14. The method according to claim 13, wherein a variation range of the first signal is between 0 volt and 5 volts, a variation range of the second signal and the third signal is between the high-voltage power supply voltage minus 5 volts and the high-voltage power supply voltage, and a variation range of the fourth signal is between 0 volt and the high-voltage power supply voltage.

15. The method according to any one of claims 10-12, wherein the high-voltage power supply voltage is 100 volts or any predetermined voltage value below 100 volts.

* * * * *